(12) United States Patent
Kishimoto

(10) Patent No.: US 6,329,261 B1
(45) Date of Patent: Dec. 11, 2001

(54) METHOD FOR FORMING A SHALLOW TRENCH ISOLATION STRUCTURE

(75) Inventor: Koji Kishimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/550,097

(22) Filed: Apr. 14, 2000

(30) Foreign Application Priority Data

Apr. 21, 1999 (JP) .................................... 11-113103

(51) Int. Cl.[7] .................................... H01L 21/331
(52) U.S. Cl. .................................... 438/359; 438/435
(58) Field of Search .................................... 438/435, 424, 438/425, 436, 471; 257/77, 76, 75, 316, 412

(56) References Cited

U.S. PATENT DOCUMENTS 5,886,368 * 3/1999 Forbes et al. ............................ 257/77
6,051,480 * 4/2000 Moore et al. ............................ 438/435

FOREIGN PATENT DOCUMENTS 5-335290  12/1993 (JP) .
5-335291  12/1993 (JP) .

* cited by examiner

*Primary Examiner*—David Nelms
*Assistant Examiner*—Dung A Le
(74) *Attorney, Agent, or Firm*—Young & Thompson

(57) ABSTRACT

A STI process for a semiconductor device includes the steps of depositing a SiOxCy film where x<2 in a trench by using a biased high-density-plasma-enhanced CVD system, and heat treating the SiOxCy film in an oxidizing ambient to remove carbon and voids therein to form a stoichiometric $SiO_2$ film without causing volume expansion. The depositing step uses a higher ratio of deposited film/sputter-etched film for avoiding plasma damages to the silicon substrate.

5 Claims, 4 Drawing Sheets

METHOD FOR FORMING A SHALLOW TRENCH ISOLATION STRUCTURE

BACKGROUND OF THE INVENTION (a) Field of the Invention

The present invention relates to a method for forming a shallow trench isolation (STI) structure and, more particularly to a method for forming a $SiO_2$ film in a shallow trench.

(b) Description of the Related Art

Along with development of higher integration density and finer fabrication process for semiconductor devices, a STI technique has been increasingly used for isolation of transistor elements instead of the conventional LOCOS technique. The STI technique is described in 1996 VLSI technology symposium proceedings, pp 156, and 1996 IEDM technical proceedings, pp 841, for example. The STI technique is free from the problem of "bird's beak" extending in the horizontal direction as encountered in the LOCOS technique, thereby achieving a finer element isolation. In the current fabrication processes for semiconductor devices, the conventional LOCOS technique by which the silicon substrate is oxidized for forming a relatively pure silicon oxide film is used for the semiconductor devices of less precise design rule whereas the STI technique is used for the semiconductor devices of more precise design rule. In the STI technique, there are some problems associated with deposition of silicon oxide film in the trench formed on the silicon substrate.

Patent Publications JP-A-5-335290 and -5-335291 describe a STI technique wherein the silicon oxide film is deposited in the trench by a biased plasma-enhanced CVD process using a high-frequency power applied to the silicon substrate. In this technique, an electron-cyclotron-resonance (ECR) process generates high-density plasma for deposition of the silicon oxide film. The source gases generally used in the biased high-density plasma-enhanced CVD process include silane ($SiH_4$), oxygen ($O_2$) and argon (Ar). This technique takes advantage of the angle dependency of the etch rate at the slope in the sputter-etching process using argon ions by applying the high-frequency power to the substrate and of the high sputtering rate at the slope. More specifically, the silicon oxide film is deposited in a small-width trench while the silicon oxide film on the corner of a rectangular profile is removed by the sputter-etching technique using argon ions.

In the technique described in the publications mentioned above, the deposition and sputter-etching of the silicon oxide film occur concurrently, wherein a higher step coverage, and thus a higher film property, in the trench is achieved with a smaller ratio of deposited film to the sputter-etched film. In this case, however, the rate of the net deposited film decreases which is obtained by subtraction of the sputter-etched film from the gross deposited film. A smaller amount of the gross deposited film is achieved by decreasing the flow rate of silane, for example. On the other hand, a higher amount of sputter-etched film is achieved by increasing the high-frequency power applied to the substrate, for example. In either case, the decrease in the ratio of deposited film/sputter-etched film improves the step coverage in the trench.

After the silicon oxide film is deposited, the silicon oxide film is removed on the active region by a chemical-mechanical polishing (CMP) process. In the techniques described in both the publications, an additional step is interposed between the film deposition step and the CMP step for increasing the throughput and the reliability of the silicon oxide film.

There is a problem in the deposition process that the ECR-CVD system has an excessively large scale due to large dimensions of the plasma source. An inductively-coupled-plasma (ICP) system and a helicon-wave-excited plasma system are noticed and practically used instead of using the ECR plasma source for deposition of interlevel dielectric film on a metallic film. The source materials in the ICP system etc. are similar to those of the ECR-CVD system, and include silicon, oxygen and argon. To obtain a silicon oxide film having a stoichiometric $SiO_2$ structure requires 1.4 or higher for the flow rate ratio of $O_2/SiH_4$. A smaller flow rate ratio of $O_2/SiH_4$ which is below 1.4 provides a silicon oxide film having a stoichiometrically silicon-rich structure, namely SiOx where x<2.

FIGS. 1A and 1B consecutively show a fabrication process using a biased high-density-plasma-enhanced CVD technique. In this process, a silicon oxide film 402 is formed on a silicon substrate 401 by a thermal oxidation process, followed by deposition of a silicon nitride film 403 thereon. Subsequently, the silicon nitride film 403, silicon oxide film 402 and silicon substrate 401 are selectively etched using a photolithographic technique and a dry etching technique to form a set of trenches 404a, 404b and 404c. Removal of the photoresist film after the formation of the trenches 404a, 404b and 404c provides the structure shown in FIG. 1A.

A silicon oxide film 405 is then deposited in each trench and on the entire surface of the silicon substrate 401 by using a biased high-density-plasma-enhanced CVD process, as shown in FIG. 1B. In this process, source gas including $SiH_4$, $O_2$ and Ar is used wherein the flow rate ratio of $O_2/SiH_4$ is above 1.5 to obtain a silicon oxide film having a stoichiometric $SiO_2$ structure. The silicon oxide film 405 is then subjected to a CMP process for planarization.

In the above process, there is a problem in that the silicon oxide film 405 often includes therein voids 406a and 406b, as shown in FIG. 1B, due to a high aspect ratio of the trenches 404a and 404b. The voids 406a and 406b do not disappear after the subsequent steps of fabrication, thereby degrading the performance of the semiconductor device. The voids are generally formed in the case of a smaller ratio of sputter-etched film to the gross deposited film in a high-density-plasma-enhanced CVD process wherein the substrate is applied with a high-frequency power. The voids are especially noticeable in a trench having a top opening of a 0.25 μm or less width and a high aspect ratio of 1.5 or more. In addition, the voids do not disappear after a heat treatment at a temperature of 1000° C. in a nitrogen ambient in the case of a silicon oxide film including substantially no impurities, such as phosphorus ions, and thus having an extremely higher glass softening temperature.

If the step coverage is to be improved for decreasing the voids by lowering the ratio of deposited film/sputter-etched film, the corners of the trench 406a or 406b including the silicon nitride films 503a to 503c, silicon oxide films 502a to 502c and the silicon substrate 501 are sputtered, as shown in FIG. 2, to have plasma damages 506a to 506e at the corners. The plasma damages 506a to 506e are generated due to the physical sputtering. Thus, the smaller ratio of deposited film/sputter-etched film improves the step coverage, and however increases the plasma damages and decreases the net deposition rate.

SUMMARY OF THE INVENTION

In view of the above, it is an object of the present invention to provide a method for forming a shallow trench used in a STI technique, which is capable of forming an excellent silicon oxide film in a trench having a small width and thus a high aspect ratio, substantially without forming a void in the resultant silicon oxide film and without damages to the underlying silicon substrate.

The present invention provides a method for forming a STI structure in a semiconductor device, including the steps of forming a trench on a semiconductor substrate, depositing a carbon-containing silicon oxide film in the trench, the silicon oxide film having a stoichiometric SiOxCy structure where x is below 2 and having a thickness which is larger than the depth of the trench, thermally treating the carbon-containing silicon oxide film to form a stoichiometric $SiO_2$ film, and polishing the $SiO_2$ film for planarization.

In accordance with the method of the present invention, when the carbon-containing silicon oxide film is subjected to the heat treatment to form the $SiO_2$ film, voids formed in the carbon-containing silicon oxide film in the trench disappear due to the heat treatment. Thus, a larger ratio of deposited film/sputter-etched film which may involve formation of the voids in the carbon-containing silicon oxide film in the trench can be employed without causing the damage onto the silicon substrate etc and without remaining voids in the resultant $SiO_2$ film.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings.

Figure 1A:
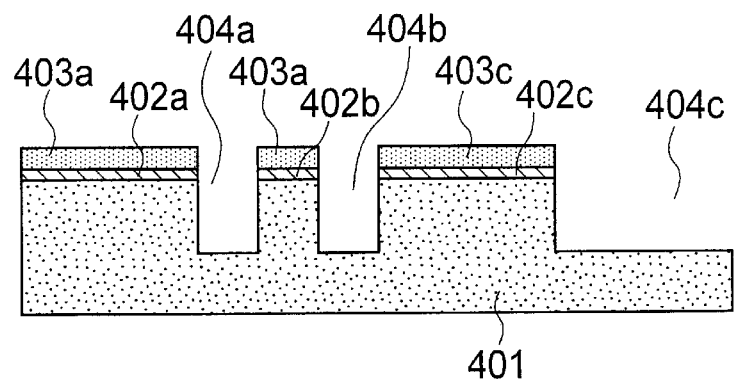
FIGS. 1A and 1B are sectional views of a semiconductor device for consecutively showing steps of a conventional method for fabrication thereof.
Figure 1B:
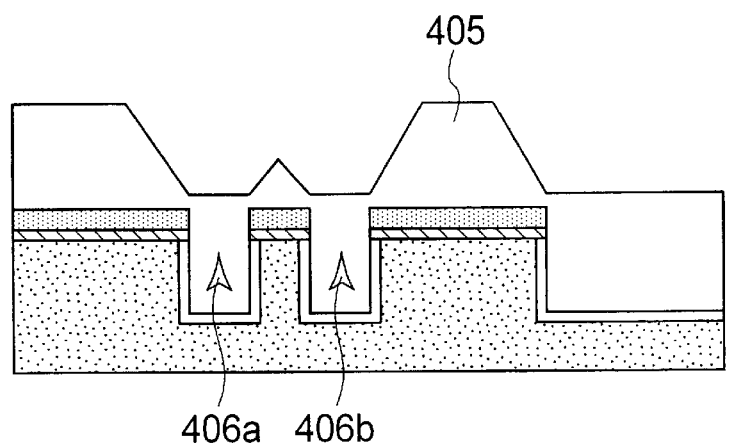
Figure 2:
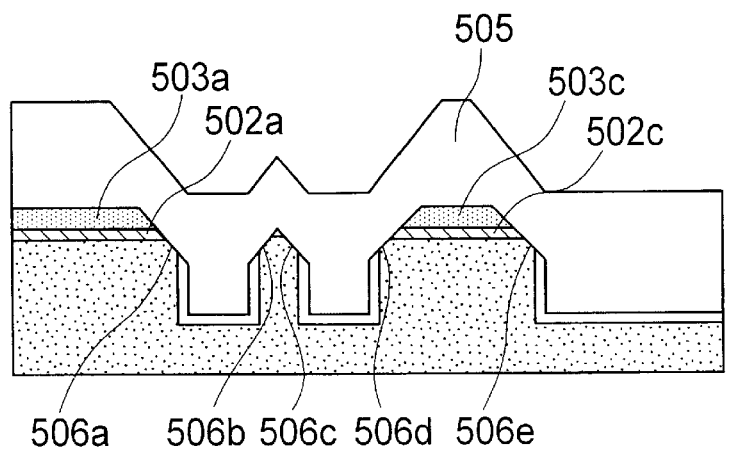
FIG. 2 is a sectional view of a semiconductor device for showing disadvantage of a modified conventional method for fabrication thereof.
Figure 3:
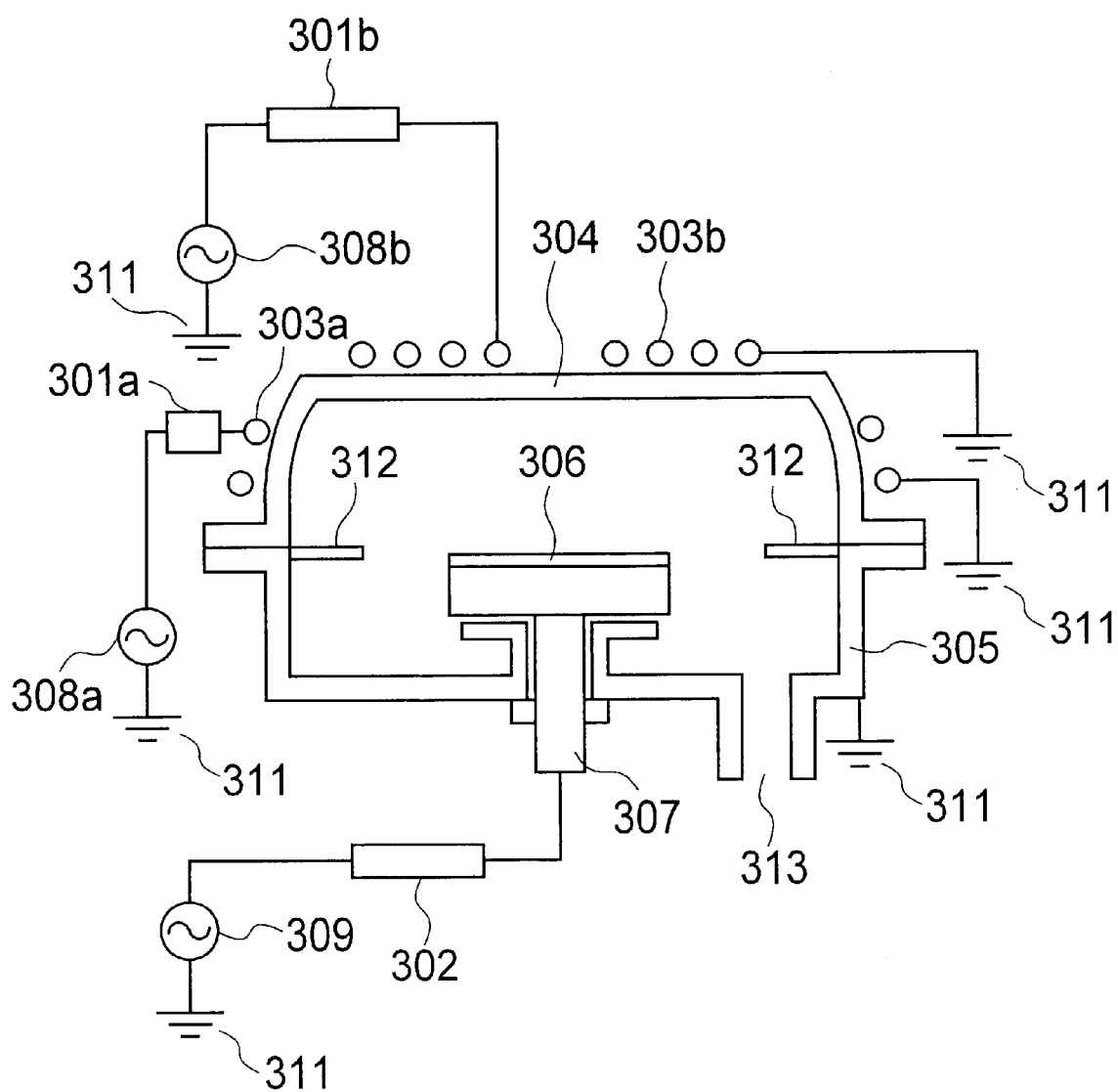
FIG. 3 is a schematic sectional view of a inductive-coupling plasma-enhanced CVD system for forming a STI structure in a semiconductor device.

Referring to FIG. 3, an inductive-coupling plasma-enhanced CVD system for fabricating a STI structure in a semiconductor device by using a method according to an embodiment of the present invention includes a beruja 304 made of alumina ($Al_2O_3$), a chamber 305 for receiving therein a wafer 306 on a pedestal 307 thereof, and inductive coils 303a and 303b disposed on the side wall and the top wall, respectively, of the beruja 304. The inductive coils 303a and 303b are applied with high-frequency power by high-frequency power sources 308a and 308b, respectively, through respective automated matching boxes 301a and 301b, thereby generating plasma within the beruja 304 and the chamber 305. The high-frequency power sources 308a and 308b operate at a changing frequency around 2.0 MHz while matching with the plasma through the automated matching boxes 301a and 301b.

The pedestal 307 mounting thereon the wafer 306 having a diameter of 8 inches is covered by a ceramic coating film, and applied with a high-frequency power having a frequency of 13.56 MHz by a high-frequency power source 309. The wafer 306 is supported by the pedestal 307 by using electrostatic absorption. Cooling water is circulated within the pedestal 307, and helium gas is supplied between the bottom surface of the wafer 306 and the top surface of the pedestal 307. The wafer temperature is controlled during deposition of a carbon-containing and silicon-rich silicon oxide film by controlling the pressure of the helium gas.

Figure 4A:
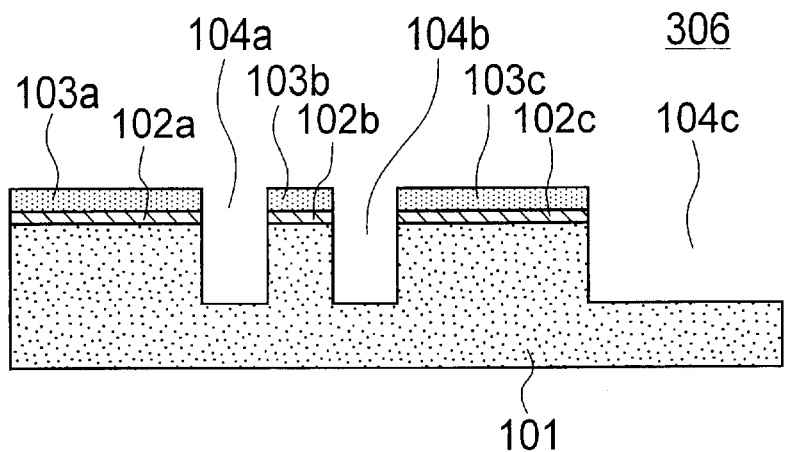
FIGS. 4A to 4F are sectional views of a semiconductor device for consecutively showing steps of a method according to an embodiment of the present invention.
Figure 4B:
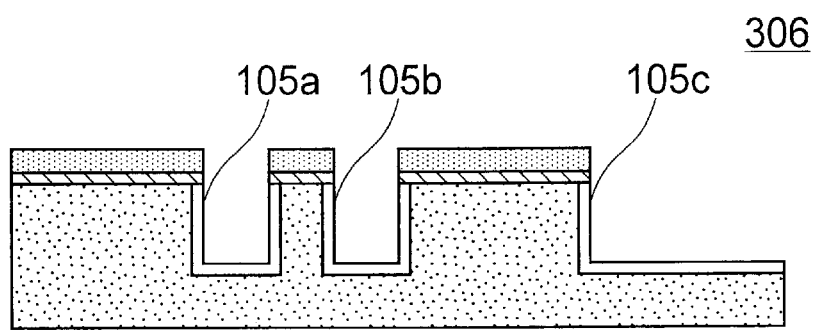

Referring next to FIGS. 4A to 4F, there is shown a wafer 306 to be subjected to a process according to an embodiment of the present invention. A silicon oxide film 102 having a thickness of 20 nm is formed on a silicon substrate 101 by using a wet oxidation technique, followed by deposition of a silicon nitride film 103 to a thickness of 150 nm by using a thermal CVD technique. The silicon nitride film 103 and the silicon oxide film 102 are then subjected to selective etching using a photolithographic technique, followed by selective etching of the silicon substrate 101 by using a dry etching technique using the silicon nitride film and the silicon oxide film as a mask to form trenches 104a to 104c, thereby obtaining the structure shown in FIG. 4A. In FIG. 4A, trenches 104a to 104c are formed in the silicon oxide films 102a to 102c, the silicon nitride films 103a to 103c and the silicon substrate 101. Each trench 104a, 104b or 104c has a top opening having a minimum width of 0.25 µm and a depth of 0.5 µm.

The wafer 306 is then subjected to a dry oxidation process at a substrate temperature of about 1100° C. to form a 40-nm-thick silicon oxide films 105a to 105c on the side and bottom surfaces of the trenches 104a to 104c exposed from the silicon oxide films 102a to 102c and the silicon nitride films 103a to 103c. The thermal oxidation process for the silicon oxide film may be replaced by a thermal CVD process by using dichlorosilane ($SiCl_2H_2$) and dinitrogen oxide ($N_2O$) as a source gas at a substrate temperature of about 900° C. and at a reduced pressure.

Figure 4C:
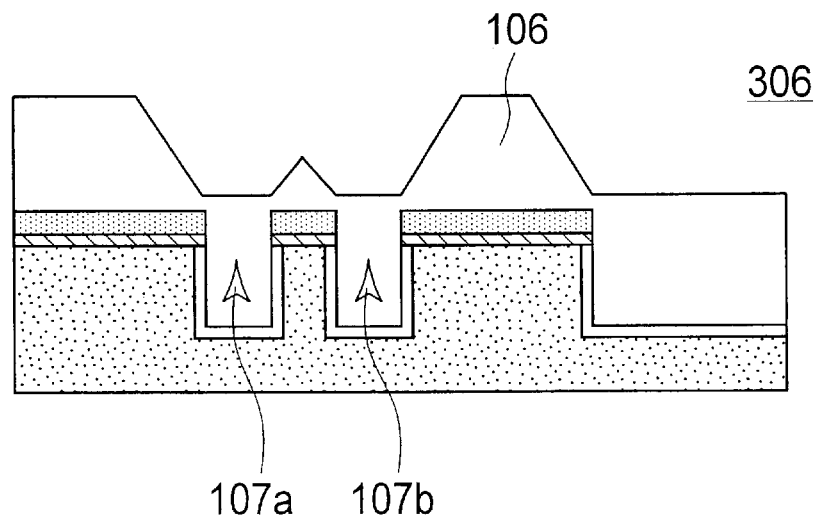
Figure 4D:
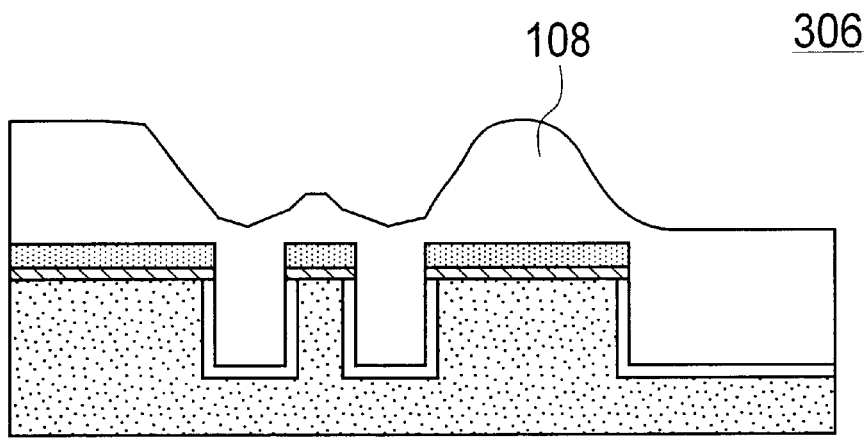
Figure 4E:
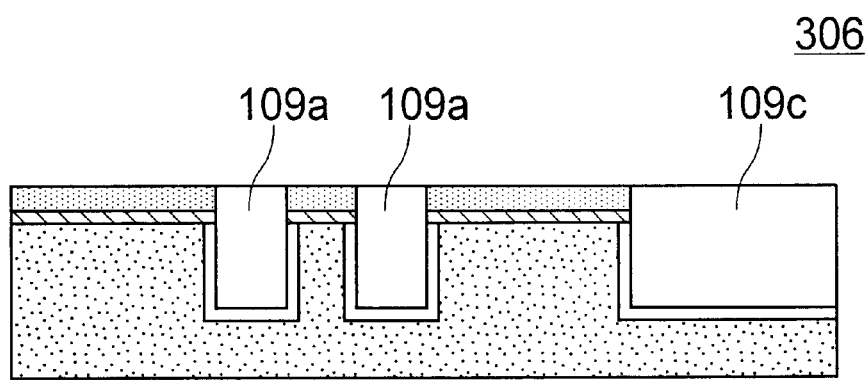
Figure 4F:
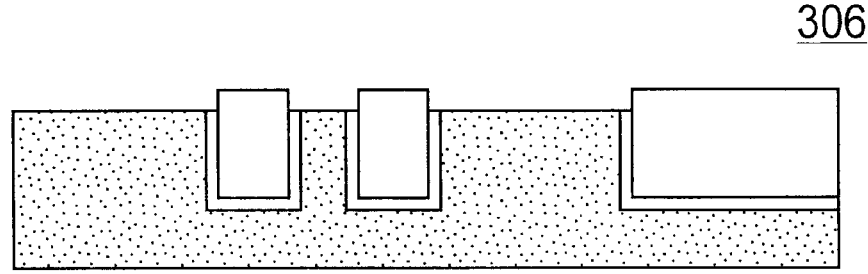

A carbon-containing and silicon-rich silicon oxide film 106, namely SiOxCy film where x<2, is then deposited on the entire surface of the wafer 306 by using the biased high-density-plasma-enhanced CVD system of FIG. 3. In the deposition, 50-sccm silane, 50-sccm methane, 50-sccm oxygen and 100-sccm argon are introduced to the chamber 305 through the gas inlet 312 shown in FIG. 3. The application of the silicon substrate 101 with the high-frequency power causes sputter-etching of a portion of the deposited SiOxCy film 106 above the side surface of the trench 104a, 104b or 104c to form a slope. Thus, the deposited SiOxCy film 106 has a slope right above the side surface of the trench, with the bottom surface of the SiOxCy film 106 being disposed right above the bottom surface of the trench, as shown in FIG. 4C. During the plasma-enhanced CVD process, voids 107a and 107b may be formed in the deposited SiOxCy film 106 within the trenches 104a and 104b each having a small width or a high aspect ratio.

By controlling the temperature of the cooling water and the helium pressure, the substrate temperature is maintained at about 400° C. The inductive coils 303a and 303b are applied with a high-frequency powers of about 3000 watts and about 1500 watts, respectively, with the pedestal 307 applied with about 2000 watts of high-frequency power. By controlling the flow rate ratio of $O_2/(SiH_4+CH_4)$ below 1.3 at this stage, the deposited SiOxCy film 106 has a stoichiometric SiOxCy structure where x<2. It is important that the ratio of deposited film/sputter-etched film be maintained at a large value sufficient for protection of the underlying layers and the silicon substrate 101 against the plasma damages irrespective of formation of the voids in the deposited SiOxCy film 106.

Subsequently, the SiOxCy film 106 is subjected to a heat treatment for about 30 minutes at a temperature about 850° C. in an oxygen ambient for providing fluidity to the SiOxCy film 106, whereby the voids 107*a* and 107*b* disappear in the SiOxCy film 106. At this stage, the carbon in the SiOxCy film 106 is removed as carbon monoxide and carbon dioxide, whereby the SiOxCy film 106 is converted to a stoichiometric $SiO_2$ film 108. The oxygen ambient in this heat treatment may be replaced by another oxidizing ambient including steam ($H_2O$) at about 700° C., or including both oxygen and the steam. In the oxidizing ambient in the embodiment or recited herein, the underlying silicon substrate 101 is not oxidized due to a relatively low temperature. In addition, due to the silicon-rich structure of the SiOxCy film 106 where x<2, the volume expansion of the silicon during oxidation thereof is cancelled by the volumes of the disappeared voids 107*a* and 107*b* and the volume of the removed carbon, thereby preventing the volume expansion of the resultant $SiO_2$ film 108 and the resultant stress applied to the substrate 101 which may generate defect in the substrate 101.

Thereafter, the top portion of the $SiO_2$ film 108 is removed by using a CMP process, thereby leaving the $SiO_2$ films 108 deposited within the trenches 104*a*, 104*b* and 104*c*, with the exposed surface of the $SiO_2$ film 108 being flush with the top surface of the silicon nitride films 103*a*, 103*b* and 103*c*. Then, the silicon nitride films 103, 103*b* and 103*c* and the silicon oxide films 102*a*, 102*b* and 102*c* are removed using a wet etching technique.

In the above embodiment, the ratio of deposited film/sputter-etched film is maintained at a relative large value for prevention of plasma damage, whereby the underlying silicon oxide films 102*a*, 102*b* and 102*c* and silicon nitride films 103*a*, 103*b* and 103*c* are not sputter-etched, and thus the silicon substrate 101 is substantially free from damages.

In addition, the oxidizing heat treatment of the SiOxCy film 106, which fluidize the SiOxCy film 106 for removal of the voids 107*a* and 107*b* and removes the carbon, causes rearrangement of bonds in the SiOxCy film 106. Thus, the SiOxCy film 106 is converted to a stoichiometric $SiO_2$ film 108, which allows employment of the known STI technique thereto.

The silicon-rich structure of the SiOxCy film 108, which allows cancellation of the volume expansion of the silicon during the oxidation thereof, prevents generation of the crack in the resultant $SiO_2$ film 108 and the defects in the silicon substrate 101.

Although methane is used in the above embodiment, the methane may be replaced by acetylene ($C_2H_2$). In this case, the flow rate ratio of 1:1 for $SiH_4/CH_4$ in the above embodiment may be replaced by a flow rate ratio of 2:1 for $SiH_4/C_2H_2$, and the flow rate of $O_2$ may be preferably reduced to some extent because the amount of hydrogen is reduced.

The source materials are not restricted to those used in the above embodiment and may be selected as desired so long as the selected source materials provide a silicon-rich silicon oxide film. This is because the high-density plasma has a high efficiency in decomposition of gas and is capable of decomposing of any gas for filming. The source materials are preferably provided as gas.

Since the above embodiments are described only for examples, the present invention is not limited to the above embodiments and various modifications or alterations can be easily made therefrom by those skilled in the art without departing from the scope of the present invention.

What is claimed is:

1. A method for forming a STI structure in a semiconductor device, comprising the steps of forming a trench on a semiconductor substrate, depositing a carbon-containing silicon oxide film in the trench, the carbon-containing silicon oxide film having a stoichiometric $SiO_xC_y$ structure where x is below 2 land having a thickness which is larger than a depth of the trench, thermally treating the carbon-containing silicon oxide film in an oxidizing ambient to form a SiO, film, and polishing the $SiO_2$ film for planarization.

2. The method as defined in claim 1, wherein said depositing step includes a high-density-plasma-enhanced CVD while applying a high-frequency power to the semiconductor substrate.

3. The method as defined in claim 2, wherein said high-density-plasma-enhanced CVD uses a reactive gas including silane, methane, oxygen and argon.

4. The method as defined in claim 1, wherein the oxidizing ambient includes $O_2$ and/or $H_2O$.

5. The method as defined in claim 1, wherein the trench forming step includes the steps of forming consecutively a silicon oxide film and a silicon nitride film on a semiconductor substrate, selectively etching the silicon oxide film and the silicon nitride film, and selectively etching the semiconductor substrate by using the silicon oxide film and the silicon nitride film as a mask.

\* \* \* \* \*